United States Patent
Schmidhammer

(10) Patent No.: US 9,190,984 B2
(45) Date of Patent: Nov. 17, 2015

(54) ADJUSTABLE CAPACITATIVE ELEMENT

(75) Inventor: Edgar Schmidhammer, Stein an der Traun (DE)

(73) Assignee: Qualcomm Technologies, Inc., San Diego, CA (US)

( * ) Notice: Subject to any disclaimer, the term of this patent is extended or adjusted under 35 U.S.C. 154(b) by 490 days.

(21) Appl. No.: 13/635,387

(22) PCT Filed: Mar. 10, 2011

(86) PCT No.: PCT/EP2011/053643
§ 371 (c)(1),
(2), (4) Date: Nov. 21, 2012

(87) PCT Pub. No.: WO2011/113749
PCT Pub. Date: Sep. 22, 2011

(65) Prior Publication Data
US 2013/0057359 A1    Mar. 7, 2013

(30) Foreign Application Priority Data

Mar. 15, 2010  (DE) .......................... 10 2010 011 411

(51) Int. Cl.
  H03H 7/38    (2006.01)
  H03J 3/20    (2006.01)
(52) U.S. Cl.
  CPC ... H03J 3/20 (2013.01); H03H 7/38 (2013.01)
(58) Field of Classification Search
  CPC ...................................... H03J 3/20; H03H 7/38
  USPC .......................................................... 333/32
  See application file for complete search history.

(56) References Cited

U.S. PATENT DOCUMENTS

| 6,259,334 | B1 | 7/2001 | Howald |
| 7,646,267 | B1 | 1/2010 | Tsironis |
| 2003/0184319 | A1 | 10/2003 | Nishimori et al. |
| 2009/0046030 | A1 | 2/2009 | Song et al. |
| 2009/0130997 | A1 | 5/2009 | Gauthier |
| 2010/0194487 | A1* | 8/2010 | Fukuda et al. ................. 333/32 |
| 2010/0225411 | A1* | 9/2010 | Maier ............................. 333/32 |

FOREIGN PATENT DOCUMENTS

| EP | 0975093 A1 | 1/2000 |
| JP | 2000068452 A | 3/2000 |
| JP | 2004085446 A | 3/2004 |

(Continued)

OTHER PUBLICATIONS

Qiao, et al., "Antenna Impedance Mismatch Measurement and Correction for Adaptive CDMA Transceivers", IEEE MTT-S International Microwave Symposium, Jun. 12, 2005, pp. 783-786.

(Continued)

*Primary Examiner* — Stephen E Jones
*Assistant Examiner* — Scott S Outten
(74) *Attorney, Agent, or Firm* — Smith Risley Tempel Santos LLC

(57) ABSTRACT

The invention relates to an adjustable capacitative element which can assume discrete capacity values the impedance values $Z_i$ of which that it can assume are distributed as evenly as possible in the Smith Chart. An adjustable capacitative element comprises a capacitor which can assume discrete capacity values. The phase of the reflection factor or the impedance values of the capacity values are interspaced equidistantly.

10 Claims, 6 Drawing Sheets

(56) References Cited

FOREIGN PATENT DOCUMENTS

| | | | |
|---|---|---|---|
| JP | 2004088701 | A | 3/2004 |
| WO | 2009108391 | A1 | 9/2009 |

OTHER PUBLICATIONS

International Search Report—PCT/EP2011/053643—ISA/EPO—Jun. 6, 2011 (140926).

* cited by examiner $Z_i; Z_0..Z_n$

ADJUSTABLE CAPACITATIVE ELEMENT

The invention relates to adjustable capacitive elements which can be used in impedance matching circuits, for example.

Adjustable capacitive elements can be used for impedance matching between passive or active circuit components of a mobile communication appliance, on the one hand, and an antenna of the communication appliance, on the other hand.

By way of example, WO 2009/108391 A1 discloses digitally adjustable capacitance banks (DTC=Digitally Tunable Capacitor) as adjustable capacitive elements.

Digitally adjustable capacitance banks comprise a number of capacitance elements, the capacitances of which adopt the values of powers of two $2^n\, C_0$ for a lowest capacitance $C_0$.

In mobile communication appliances, the aim in general is for a particular impedance range (shown in the Smith Chart, for example) to be covered by the adjustable capacitive element with an adequate coverage density of achievable impedance states of the element.

It has been found that the achievable impedance states of known adjustable capacitive elements do not provide uniform coverage of the impedance range that is to be covered. In particular, the Smith Chart contains an area in which the achievable, i.e. adjustable, impedance states mount up, while there is an area, e.g. around the "open circuit" point, in which the achievable impedance states are arranged less densely.

Mobile radio specifications can require a minimum quality for the matching, which results in a minimum density of achievable impedance states for impedance matching.

In known impedance matching circuits, the number of achievable impedance states is therefore chosen to be high enough for the minimum density of achievable impedance states to be obtained in the impedance range that is to be covered, even on the aforementioned critical areas. However, one problem with a large number of achievable impedance states is then the control or regulation of the impedance matching circuit. The reason is that if an impedance matching circuit provides a very large number of achievable impedance states, high demands are made on an algorithm for operating the circuit. In general, it is no longer possible to "test" all states individually, for example.

It is therefore an object of the present invention to specify an improved adjustable capacitive element. Such an adjustable capacitive element is intended to allow more uniform coverage of the achievable impedance states in the Smith Chart, in particular. In addition, when connected up in an impedance matching circuit, for example, such an adjustable capacitive element is intended to be easier to control or regulate than known adjustable capacitive elements.

These objects are achieved by an adjustable capacitive element according to claim 1. Dependent claims specify possible refinements of the adjustable capacitive element.

An adjustable capacitive element according to the invention comprises a capacitor which is intended to accept n+1 discrete capacitance values $C_0$ to $C_n$. In this case, the capacitance values $C_i$ from $C_0$ to $C_n$ are chosen such that the impedance values $Z_i$, which are dependent on the capacitance values, from $Z_0=Z(C_0)$ to $Z_n=Z(C_n)$ or the phase values $\phi_i(C_i)$, which are dependent on the capacitance values, from $\phi_0(C_0)$ to $\phi_n(C_n)$ are at equidistant intervals. $Z(C)$ is the frequency-dependent impedance of the capacitive element. In this case, the impedance of the capacitive element is a function of the capacitance C of the capacitor. $\phi(C)$ is the phase of the reflection factor $$p = \frac{Z - Z_0}{Z + Z_0}$$

and is likewise dependent on the capacitance C of the capacitor. $Z_0$ is a standard impedance.

n is an integer. The index "i" denotes individual discrete capacitance values, phase values or impedance values.

$Z_0$ may be the standard impedance for a matching network for a mobile communication appliance. In particular, $Z_0$ may be 50 Ω.

Known digitally tunable capacitance banks have n capacitance elements and accordingly $2^n$ options at equidistant intervals for adjusting the total capacitance of the bank. It can be seen that the capacitance values at equidistant intervals correspond to admittance values at equidistant intervals. Neither the impedance values associated with the discrete capacitance values nor the phase values associated with the discrete capacitance values are at equidistant intervals, however.

An adjustable capacitive element of the type according to the invention is distinguished by a more uniform distribution of the impedance values corresponding to the capacitance values in the Smith Chart. This makes it possible to reduce the total number of achievable capacitance values, i.e. of achievable impedance values, in comparison with digitally tunable capacitance banks and nevertheless to obtain good coverage of an impedance range that is to be covered.

In one embodiment, the adjustable capacitive element comprises a capacitor which is intended to assume n+1 discrete capacitance values $C_0$ to $C_n$, wherein the n+1 phase values $\phi_i(C_i)$ from $\phi_0(C_0)$ to $\phi_n(C_n)$ are at equidistant intervals. In this case, $\phi_0$ indicates the smallest phase to be adjusted and $\phi_n$ indicates the largest phase to be adjusted. For a desired phase $\phi_i$, the associated capacitance of the capacitor $C_i$ can be chosen as follows:

$$C_i = \frac{1}{\omega Z_0} \frac{-\sin\phi_i}{(1 + \cos\phi_i)}$$

where ω is the angular frequency of a radio-frequency signal.

Such an adjustable capacitive element, has, particularly around the "open circuit" point in the Smith Chart, a sufficiently high coverage density of achievable impedance states, without a large number of impedance states being "wasted" because these states mount up excessively in another area of the Smith Chart.

In one embodiment, the adjustable capacitive element comprises a capacitor which is intended to accept n+1 discrete capacitance values $C_0$ to $C_n$, wherein the n+1 impedance values $Z_i(C_i)$ from $Z_0(C_0)$ to $Z_n(C_n)$ are at equidistant intervals. In this case, the capacitance of the capacitor which is associated with an achievable, desired impedance $Z_i$ is $$C_i = \frac{1}{\omega Z_i},$$

where ω is the angular frequency of a radio-frequency signal.

In a similar manner to the embodiment cited above, the achievable impedance states of this capacitive element are distributed more uniformly in comparison with the achievable impedance states of a conventional digitally tunable capacitance bank.

The two embodiments cited above are not mutually exclusive. Both embodiments may be connected up together in an impedance matching circuit and operated jointly.

In one embodiment, the capacitor comprises a varactor, a capacitance bank having capacitance elements which can be individually connected in addition to the capacitor, or at least two capacitance elements which can be exclusively individually connected in addition to the capacitor.

Provision may indeed be made for a capacitance bank to be connected up as a capacitor of the adjustable capacitive element. Only digitally tunable capacitance banks as solely present capacitance elements have the disadvantages described in the introduction and, when connected up exclusively, need to be avoided.

Varactors may be provided for use as a capacitor. Varactors generally have a continuous spectrum of adjustable capacitances. However, a varactor provided for the invention is then provided for the purpose of assuming the aforementioned n+1 discrete states. For this, a control or regulatory circuit may be provided.

In one embodiment, the capacitor also comprises two digitally adjustable capacitance banks which provide piece-by-piece linear approximation of contiguous capacitance ranges. In this case, a capacitance range comprises m of the n+1 adjustable capacitance values of the capacitor, where $2<=m<=n$. The $2^m$ achievable capacitance values from a digitally tunable capacitance bank are at equidistant intervals. If the total capacitance of the digitally tunable capacitance bank is plotted against the index i, which indicates the number of the switching state, all the capacitance values are on a straight line. A corresponding plot of the capacitance values against the number of the switching state i from the capacitive element according to the invention deviates from the straight line. The corresponding points are on a curved line. A curved line can be approximated more or less locally by straight sections, however. The advantage of the present invention, the more uniform coverage of the impedance densities in the Smith Chart, is achieved even when digitally tunable capacitance banks are used for local approximation of the curved capacitance line.

In one embodiment, the adjustable capacitive element is connected up in series in an RF signal path of an impedance matching circuit. Impedance matching circuits generally comprise a signal path in which RF signals propagate. The impedance matching is then achieved by virtue of the capacitive element connected up in the signal path adopting a particular capacitance $C_i$ provided for this purpose and thereby performing impedance matching as an impedance element.

In one embodiment, the adjustable capacitive element is connected up in an impedance matching circuit. The impedance matching circuit comprises an RF signal path. The adjustable capacitive element is connected up in a parallel path of the impedance matching circuit between the RF signal path and ground.

In one embodiment the adjustable capacitive element is connected up in series in the RF signal path of an impedance matching circuit. A digitally tunable capacitance bank is connected up in a parallel path between the RF signal path and ground.

It has been found that a digitally tunable capacitance bank which is connected up in a parallel path between an RF signal path and ground allows achievable impedance states in the Smith Chart which are not too densely amassed. Such a digitally tunable capacitance bank can therefore make do with a not excessive number of achievable impedance states and can nevertheless deliver good coverage, e.g. around the "open circuit" point. In this case, an adjustable capacitive element according to the invention is connected up in the signal path in series with the signal path, said capacitive element covering the area of the Smith Chart in which the impedance states of a digitally tunable capacitance bank would mount up to a particular degree. The combination of both adjustable capacitive elements then allows good coverage of the total area that is to be covered in the Smith Chart. States neither mount up locally to a particularly dense degree nor is the coverage too low locally.

An adjustable capacitive element according to the invention may have 13 (n=12) achievable switching states, for example. A digitally tunable capacitance bank may have $2^4=16$ achievable switching states. The combination of both adjustable capacitive elements accordingly produces a number of 13*16=208 achievable switching states. This number is considerably lower than the number of an impedance matching circuit with, by way of example, $2^{10}=1024$ achievable switching states.

In one embodiment, the standard impedance is 50Ω.

In one embodiment, the capacitor comprises cascaded capacitance elements. Cascaded capacitance elements are better protected against high applied RF powers by the cascading. Since the total number of achievable impedance states is generally reduced in comparison with digitally tunable capacitance banks, the total number of capacitance elements of the capacitor may also be reduced. This reduction can firstly be used to obtain electrical components of smaller physical size. Secondly, the lower space requirement can also be used to cascade particularly vulnerable capacitance elements.

An adjustable capacitive element is thus additionally obtained which, more or less as a side effect, has a lower space requirement or an increased power handling capability.

The invention is explained in more detail below with reference to exemplary embodiments and associated schematic figures, in which:

FIG. 1 shows an impedance matching circuit with known adjustable capacitive elements, FIG. 2 shows the coverage density obtained by known adjustable capacitive elements in the Smith Chart, FIG. 3 shows the equidistant phases in the Smith Chart according to an embodiment of the invention, FIG. 4 shows the linear phase/index plot, FIG. 5 shows the coverage density of the achievable impedance states according to an embodiment with equidistant phases, FIG. 6 shows the nonlinear dependency of the capacitance on the index i of the switching state, FIG. 7 shows the nonequidistant intervals for the phase of the embodiment with equidistant impedance states, FIG. 8 shows the nonlinear phase-index plot for an embodiment with equidistant impedance states, FIG. 9 shows the coverage density in the Smith Chart for equidistant impedance states, FIG. 10 shows the coverage density in the Smith Chart for an embodiment with equidistant impedance states in a series path when a digitally tunable capacitance bank is simultaneously connected up in a parallel path, FIG. 11 shows adjustable capacitive elements connected up in an impedance matching circuit in a manner which corresponds to FIG. 10, FIG. 12 shows the piece-by-piece linear approximation of a curved capacitance/index line, FIG. 13 shows individual capacitance elements schematically connected up with three "two bit" digitally tunable capacitance banks, FIG. 14 shows an embodiment of a capacitor having 13 individually connectable capacitance elements, FIG. 15 shows quality factors for a digitally tunable capacitance bank, FIG. 16 shows quality factors for an adjustable capacitive element according to the invention.

FIG. 1 shows an impedance matching circuit IAS with a signal path SP. A capacitive element is connected up in series in the signal path. A second capacitive element connects the signal path SP to ground GND. Two inductive elements likewise connect the signal path SP to ground GND. Such an impedance matching circuit IAS can bring about the impedance between active or passive circuit components of a mobile communication appliance and a load impedance, e.g. an antenna.

FIG. 2 shows the impedance distribution of achievable impedance states for a conventional digitally tunable capacitance bank (DTC=Digitally Tunable Capacitor). Mapped in the center of the Smith Chart is the standard impedance, e.g. 50Ω. The impedance range which can be covered by the digitally tunable capacitance bank is clearly visible. In this coverable impedance range, the states mount up in one region at slightly lower nonreactive resistances and low inductive values, i.e. "above left" of the standard impedance. In the area of the idle state, the density of the adjustable impendence values is distinctly reduced, on the other hand.

FIG. 3 shows the phase of the reflection coefficient $$\rho = \frac{Z - Z_0}{Z + Z_0}$$

for an adjustable capacitive element according to the invention in which the adjustable, i.e. achievable, impedance states have equidistant phase differences. The n+1 adjustable impedance values $Z_i$, which are numbered continuously from 0 to n, are profiled at the bottom edge of the Smith Chart. Losses are thus not taken into account. This edge corresponds to the y axis, i.e. the imaginary axis, of a conventionally drawn complex plane. The Smith Chart clearly reveals equidistant phase differences, since the phases $\phi_i$ are proportional to the length of an arc of a circle from the idle state onward ($z=\infty$).

Figure 1:
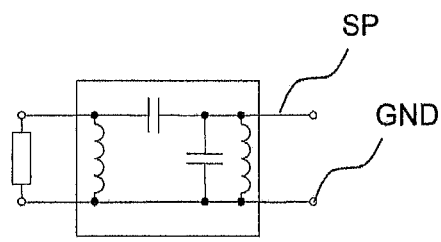
Figure 2:
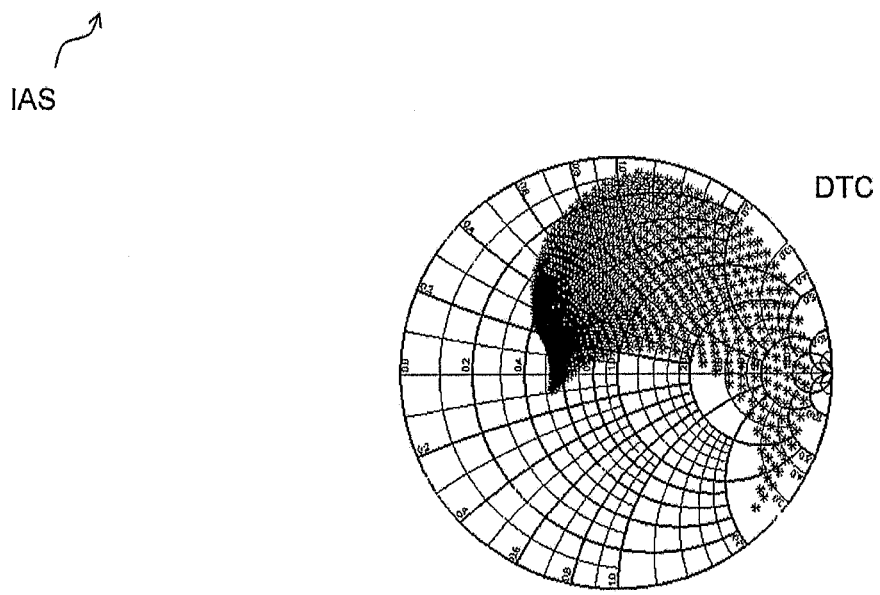
Figure 3:
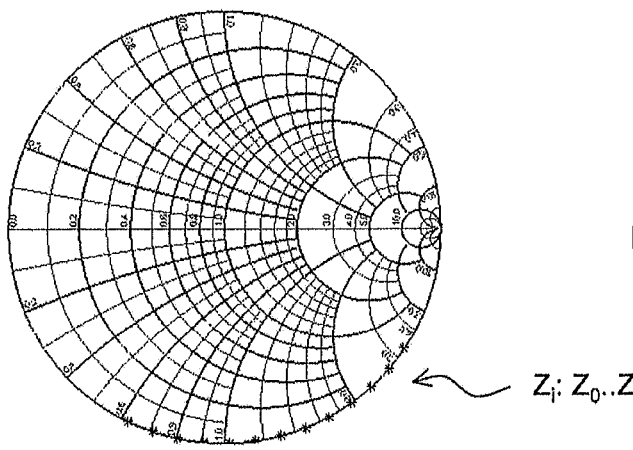
Figure 4:
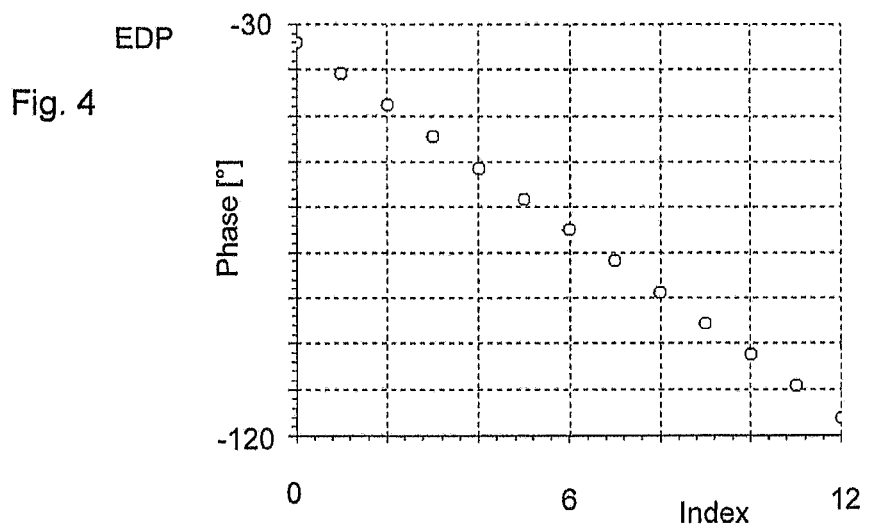
FIG. 4 shows the dependency of the phase on the count index i, which runs between 0 and 12. A consequence of the equidistant intervals between the phases of the impedance states is that the value of the phase, plotted against the switching index, is on a straight line.
Figure 5:
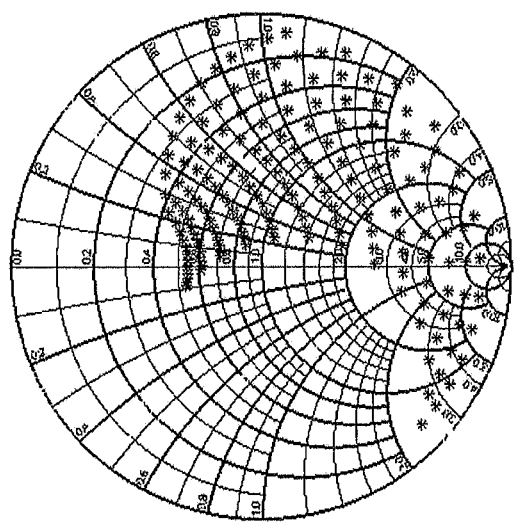
FIG. 5 shows the density distribution of the achievable impedance states $Z_i$ for an adjustable capacitative element in which the phases $\phi_i$ of the reflection factors $\rho_i$ are at equidistant intervals. It can clearly be seen that in the case of the invention the state distribution is distinctly more homogeneous than is shown in the Smith Chart in FIG. 2, for example.
Figure 6:
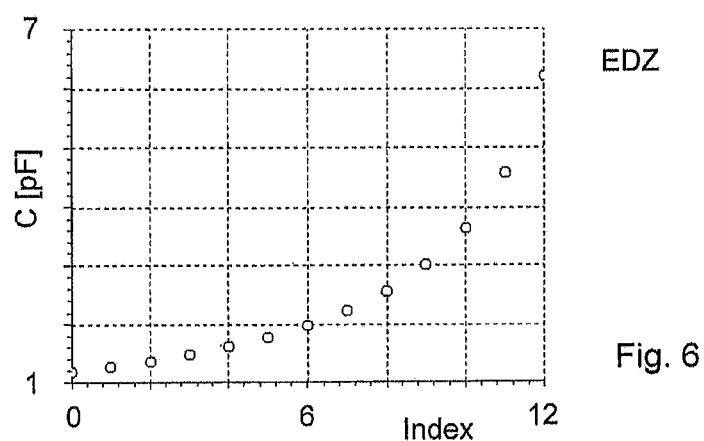

FIG. 6 shows how the capacitances of the individual switchable states, numbered continuously from 0 to 12, can be adjusted in order to obtain the distribution in FIG. 5. The equidistant intervals for a digitally tunable capacitive element would be on a straight line. The capacitance values according to an embodiment with equidistant impedances (EDZ=Eequidistant Impedance Domain) are on a curved line.

Figure 7:
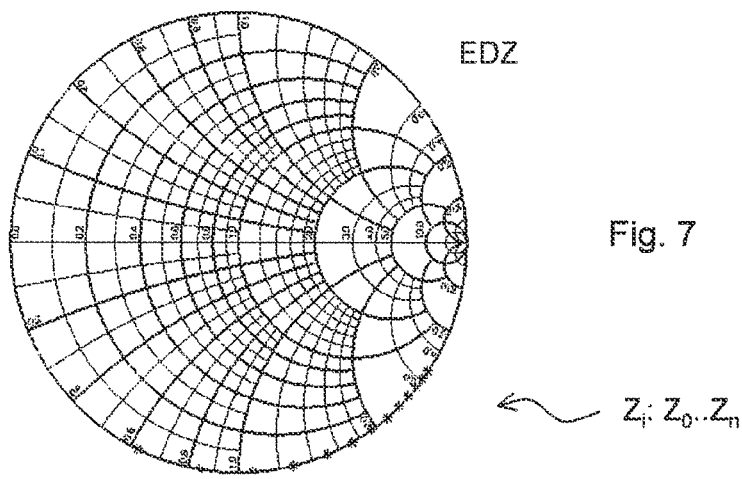

FIG. 7 shows the nonequidistant phase values of the equidistant impedance states $Z_i$.

Figure 8:
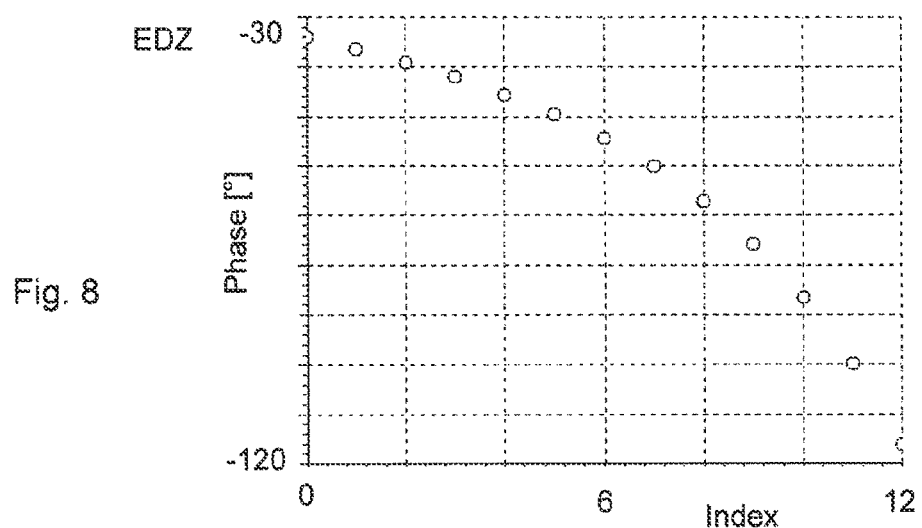

FIG. 8 shows the absolute phase values of an embodiment with equidistant impedance intervals $Z_i$, plotted against the index i.

Figure 9:
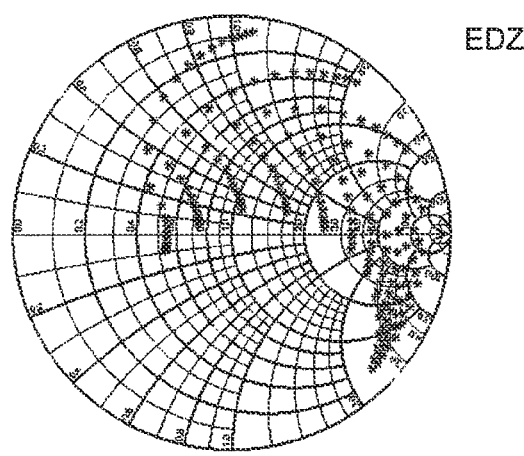

FIG. 9 shows the density distribution for the achievable states of an embodiment in which the achievable impedance states $Z_i$ are arranged equidistantly.

Figure 10:
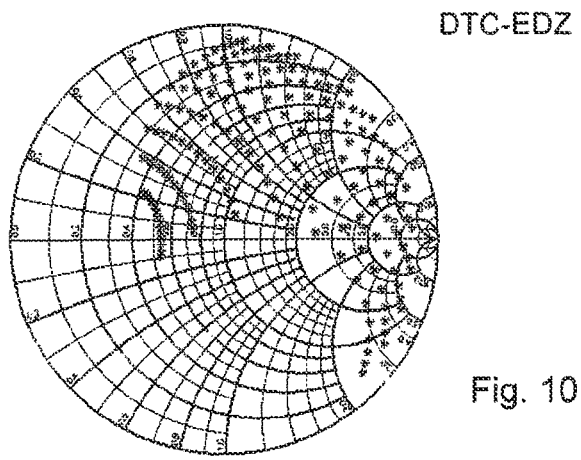

FIG. 10 shows the density distribution of the achievable impedance states $Z_i$ of an impedance matching circuit, wherein an adjustable capacitive element with equidistant impedance intervals is connected up in series in the signal path and wherein a conventional digitally tunable capacitance bank is connected up in a parallel path between the signal path and ground. It can clearly be seen that the achievable impedance states are arranged essentially uniformly within the coverable impedance range.

Figure 11:
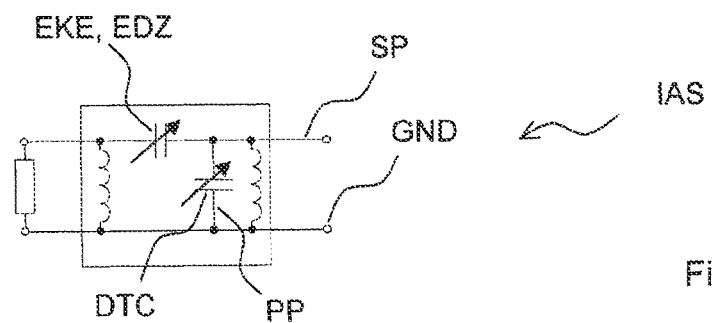

FIG. 11 illustrates an impedance matching circuit IAS with adjustable capacitive elements EDZ, DTC (EDZ—Equidistant Impedance Domain), (DTC=Digitally Tunable Capacitor). An adjustable capacitive element EKE is connected up in the signal path SP of the impedance matching circuit IAS. In this case, the adjustable capacitive element EKE is an adjustable capacitive element with impedance values EDZ at equidistant intervals. A conventional digitally tunable capacitance bank DTC is connected up in a parallel path PP between the signal path and ground GND.

Figure 12:
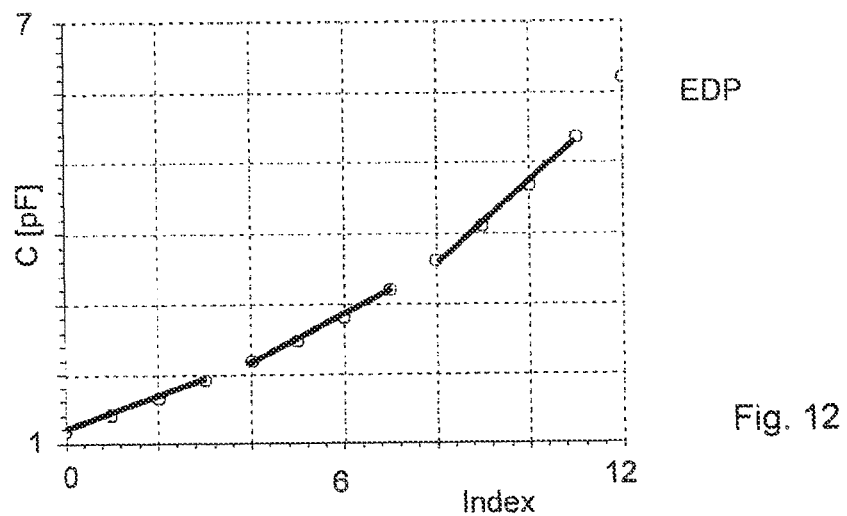

FIG. 12 shows how the nonlinear capacitance profile of the various adjustable capacitance values can be provided with an at least piece-by-piece linear approximation. A first digitally tunable capacitance bank with four possible switching states can cover the four switching states, i=0 to i=3, of the adjustable capacitive element with the lowest capacitances. A second digitally tunable capacitance bank can cover the switchable capacitance states i=4 to i=7. A third digitally adjustable capacitance bank can cover the capacitance value i=8 to i=11. Since the gradient of the capacitance curve C increases as the index rises, the different digitally switchable capacitance banks admittedly each have capacitance values at equidistant intervals. The respective interval between the capacitance values is different in all three DTCs, however.

The switching state with the index number i=12 may be formed by a single capacitance element. The split of the switching states over digitally adjustable capacitance banks is preferably chosen such that the total switching complexity is as low as possible and that the deviation of the linear approximation from the desired curved line is as small as possible.

Figure 13:
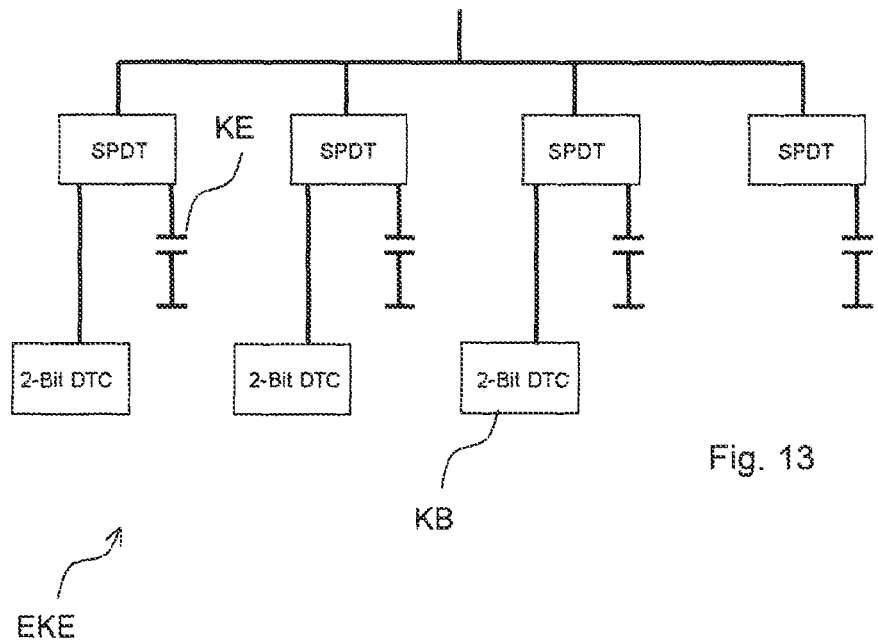

FIG. 13 illustrates an embodiment of an adjustable capacitive element EKE comprising capacitance elements KE and capacitance banks KB, which may be "two bit" digitally tunable capacitance banks, for example. Switches, for example SPDT switches (SPDT=Single Pole Double Throw), can be used to additionally connect individual capacitive elements or individual capacitance banks, which themselves in turn comprise individual capacitance elements.

Figure 14:
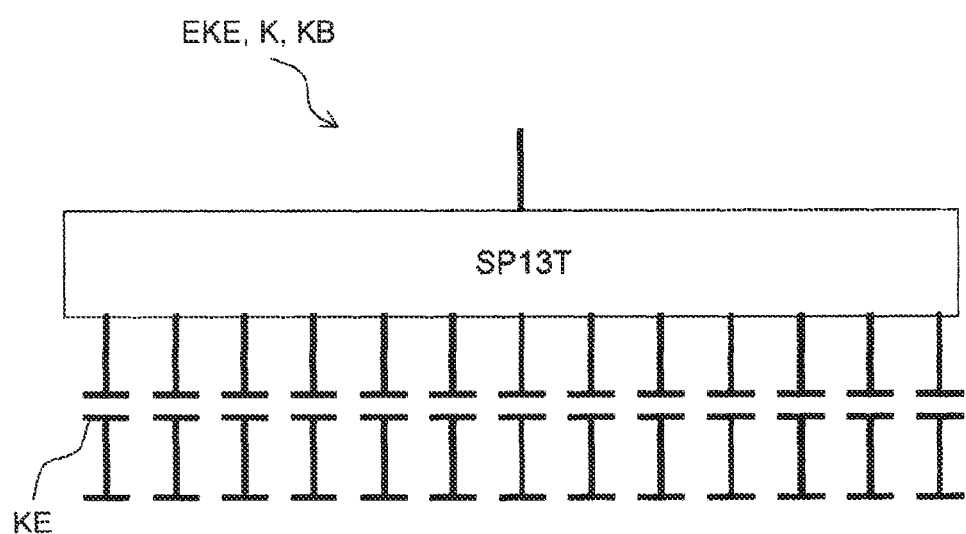

FIG. 14 shows an alternative embodiment with 13 capacitive elements. A single SP13T (SP13T=Single Pole 13 Throw) switch can be used to additionally connect every single one of the 13 capacitance elements KE exclusively for the purpose of adjusting the capacitance of the capacitor for the adjustable capacitive element.

The circuit arrangement shown in FIG. 14 is therefore simultaneously an adjustable capacitive element EKE, a capacitor K and a capacitance bank KB.

Figure 15:
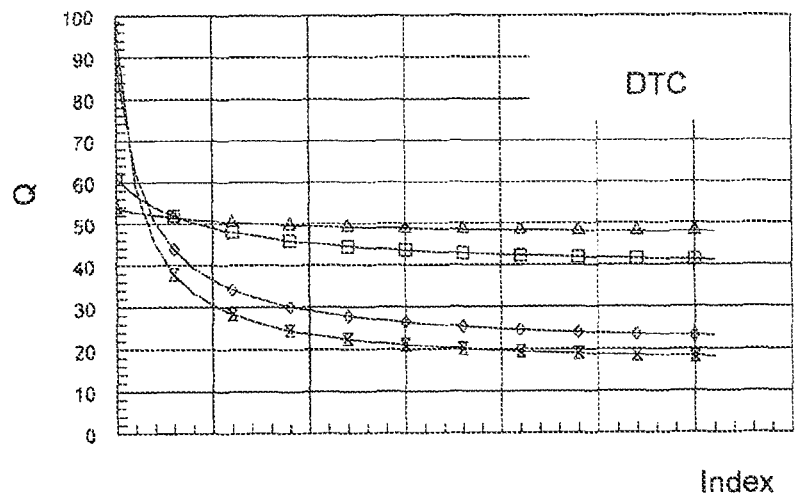

FIG. 15 shows profiles for the dimensionless quantity factor Q, which is a measure of the quality of the capacitive element in an AC circuit. In this case, the curve identified by triangles denotes the frequency 824 MHz, the curve identified by squares denotes the frequency 960 MHz, the curve identified by diamonds denotes the frequency 1710 MHz and the curve identified by hourglass-like markings denotes the frequency 2170 MHz. It can clearly be seen that the quality factor Q is below Q=50 from a certain index onward for all frequencies.

Figure 16:
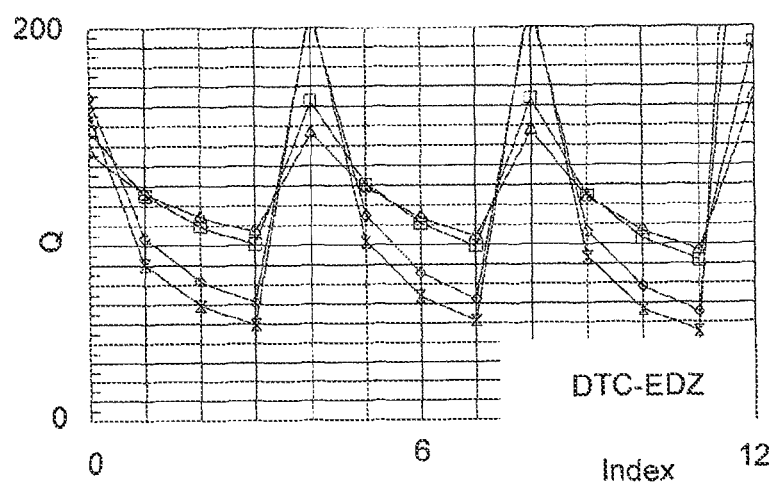

By contrast, the quality factor of an impedance matching circuit with a capacitive element according to the invention in the signal path and a conventional digitally tunable capacitive element (DTC) in a parallel path is shown in FIG. 16. Particularly the index numbers 4, 8 and 12 have the quality factor above 140 for all four frequencies.

In order to implement switches according to the invention which switch capacitance elements, a suitable technology may be one which is based on gallium arsenide, on CMOS technology, on MEMS technology or on carbon technology, e.g. graphene. An adjustable capacitive element which may be connected up in a signal path or in a parallel path can adopt 10, 11, 12, 13, 14, 15 or, generally, n+1 different switching states. If a circuit element is intended to withstand a power level of 35 dBm, for example, without damage then more sensitive capacitance elements may accordingly be of cascaded design.

Particularly when a maximum phase difference between switching states of the impedance matching circuit is prescribed, an adjustable capacitive element with phase values for the reflection factor which are at equidistant intervals may be preferred.

An adjustable capacitive element according to the invention is not limited to one of the exemplary embodiments described. Combinations and variations, which also comprise further inductive or capacitive elements or further switches, for example, are likewise exemplary embodiments according to the invention.

LIST OF REFERENCE SYMBOLS

EKE: Adjustable capacitive element
K: Capacitor
KB: Capacitance bank
KE: Capacitance element
IAS: Impedance matching circuit
SP: Signal path
PP: Parallel path

What is claimed is:

1. An adjustable capacitive element, comprising a capacitor which is intended to accept n+1 discrete capacitance values $C_0$ to $C_n$, wherein
the capacitance values $C_i$ from $C_0$ to $C_n$ are chosen such that a set of impedance values $Z_i$, which are dependent on the capacitance values, from $Z_0=Z(C_0)$ to $Z_n=Z(C_n)$ or a set of phase values $\phi_i(C_i)$, which are dependent on the capacitance values, from $\phi_0(C_0)$ to $\phi_n(C_n)$ are at equidistant intervals, where n is an integer greater than one,
Z(C) is the frequency-dependent impedance of the capacitive element,
$\phi(C)$ is the phase of the reflection factor $$\rho = \frac{Z - Z_0}{Z + Z_0},$$

and
$Z_0$ is a standard impedance.

2. The adjustable capacitive element according to claim 1, comprising a capacitor which is intended to accept n+1 discrete capacitance values $C_0$ to $C_n$, wherein
the n+1 impedance values $Z_i(C_i)$ from $Z_0(C_0)$ to $Z_n(C_n)$ are at equidistant intervals, and $$C_i = \frac{1}{\omega Z_i},$$

where $\omega$ is the angular frequency of a radio-frequency signal.

3. The adjustable capacitive element according to claim 2, wherein
the adjustable capacitive element is connected in series in the RF signal path of an impedance matching circuit, and
a digitally tunable capacitance bank is connected in a parallel path between the RF signal path and ground.

4. The adjustable capacitive element according to claim 1, comprising a capacitor which is intended to accept n+1 discrete capacitance values $C_0$ to $C_n$, wherein
the n+1 phase values $\phi_i(C_i)$ from $\phi_0(C_0)$ to $\phi_n(C_n)$ are at equidistant intervals and $$C_i = \frac{1}{\omega Z_0} \frac{-\sin\phi_i}{(1 + \cos\phi_i)},$$

where $\omega$ is the angular frequency of a radio-frequency signal.

5. The adjustable capacitive element according to claim 1, wherein the capacitor comprises
a varactor,
a capacitance bank having capacitance elements which can be individually connected, or
at least two capacitance elements which can be exclusively individually connected.

6. The adjustable capacitive element according to claim 1, the capacitor of which also comprises two digitally adjustable capacitance banks which provide piece-by-piece linear approximation of contiguous capacitance ranges.

7. The adjustable capacitive element according to claim 1, wherein the adjustable capacitive element is connected in series in an RF signal path of an impedance matching circuit.

8. The adjustable capacitive element according to claim 1, wherein
the adjustable capacitive element is connected in an impedance matching circuit,
the impedance matching circuit comprises an RF signal path, and
the adjustable capacitive element is connected in a parallel path between the RF signal path and ground.

9. The adjustable capacitive element according to claim 1, wherein the standard impedance is 50 ohms.

10. The adjustable capacitive element according to claim 1, wherein the capacitor comprises cascaded capacitance elements.

* * * * *